United States Patent
Sato et al.

(10) Patent No.: US 8,188,372 B2
(45) Date of Patent: May 29, 2012

(54) FLEX-RIGID PRINTED WIRING BOARD AND MANUFACTURING METHOD THEREOF

(75) Inventors: Akihiro Sato, Ichinoseki (JP); Masahiro Sasaki, Ichinoseki (JP); Tadahiro Ohmi, Sendai (JP); Akihiro Morimoto, Sendai (JP)

(73) Assignees: Daisho Denshi Co., Ltd., Tokyo (JP); Tohoku University, Miyagi (JP)

( * ) Notice: Subject to any disclaimer, the term of this patent is extended or adjusted under 35 U.S.C. 154(b) by 331 days.

(21) Appl. No.: 12/442,016

(22) PCT Filed: Sep. 21, 2006

(86) PCT No.: PCT/JP2006/318691
§ 371 (c)(1),
(2), (4) Date: Nov. 5, 2009

(87) PCT Pub. No.: WO2008/035416
PCT Pub. Date: Mar. 27, 2008

(65) Prior Publication Data
US 2010/0051325 A1    Mar. 4, 2010

(51) Int. Cl.
*H05K 1/02* (2006.01)
*H05K 3/46* (2006.01)

(52) U.S. Cl. ........ 174/254; 174/255; 174/256; 174/261; 361/749; 361/751; 29/825; 29/846; 29/852

(58) Field of Classification Search .......... 174/254–267; 361/749, 750, 760–767, 790–798; 257/686, 257/678, 700–727, 797–799; 438/106–118, 438/120–124
See application file for complete search history.

(56) References Cited

U.S. PATENT DOCUMENTS

| | | | |
|---|---|---|---|
| 4,338,149 A * | 7/1982 | Quaschner | 156/248 |
| 4,625,786 A * | 12/1986 | Carter et al. | 160/84.06 |
| 4,675,786 A | 6/1987 | Mizuko et al. | |
| 4,931,134 A * | 6/1990 | Hatkevitz et al. | 216/17 |
| 5,008,496 A * | 4/1991 | Schmidt et al. | 174/254 |
| 5,072,074 A * | 12/1991 | DeMaso et al. | 174/254 |

(Continued)

FOREIGN PATENT DOCUMENTS

JP    3-68187    3/1991

(Continued)

OTHER PUBLICATIONS

European Patent Office; Search Report in European Patent Application No. 06 79 8183 dated Oct. 30, 2009; 8 pages.

(Continued)

*Primary Examiner* — Michail V Datskovskiy
(74) *Attorney, Agent, or Firm* — Wood, Herron & Evans, LLP

(57) ABSTRACT

A flex-rigid printed wiring board is provided which can retain flexibility of a flexible portion while increasing durability of the flexible portion against folding, and can ensure conduction in a rigid portion, and a method of manufacturing the printed wiring board.

The flex-rigid printed wiring board includes a conductor layer provided on at least one face of a base film, one region of the wiring board containing the base film being a rigid region, an another region containing the base film being a flexible region. The average thickness "tf" of the conductor layer on the base film formed in the flexible region and the average thickness "tR" of the conductor layer on the base film formed in the rigid region satisfy the relationship of tf<tR.

6 Claims, 9 Drawing Sheets

U.S. PATENT DOCUMENTS

| | | | | |
|---|---|---|---|---|
| 5,144,534 A | * | 9/1992 | Kober | 361/751 |
| 5,144,742 A | * | 9/1992 | Lucas et al. | 29/830 |
| 5,206,463 A | * | 4/1993 | DeMaso et al. | 174/254 |
| 5,219,640 A | * | 6/1993 | Gazit et al. | 428/209 |
| 5,263,248 A | * | 11/1993 | Kiyota et al. | 29/846 |
| 5,615,088 A | * | 3/1997 | Mizumo | 361/749 |
| 5,629,497 A | | 5/1997 | Sato et al. | |
| 5,633,480 A | * | 5/1997 | Sato et al. | 174/255 |
| 6,099,745 A | * | 8/2000 | McKenney et al. | 216/13 |
| 6,162,996 A | * | 12/2000 | Schmidt et al. | 174/259 |
| 6,288,343 B1 | * | 9/2001 | Ahn et al. | 174/254 |
| 6,841,738 B2 | * | 1/2005 | Michiwaki et al. | 174/254 |
| 6,902,949 B2 | * | 6/2005 | Yamazaki et al. | 438/106 |
| 6,927,344 B1 | * | 8/2005 | Gall et al. | 174/254 |
| 6,972,383 B2 | * | 12/2005 | Akama | 174/264 |
| 7,059,868 B1 | | 6/2006 | Yan | |
| 7,238,891 B2 | * | 7/2007 | Muenzberg | 174/255 |
| 2005/0215124 A1 | | 9/2005 | Vale et al. | |

FOREIGN PATENT DOCUMENTS

| | | | |
|---|---|---|---|
| JP | 04-268783 | | 9/1992 |
| JP | 6-334279 | | 12/1994 |
| JP | 7-106766 | | 4/1995 |
| JP | 407106766 A | * | 4/1995 |
| JP | 08-335759 | | 12/1996 |
| JP | 09-102658 | | 4/1997 |
| JP | 2000-12991 | | 1/2000 |
| JP | 2001-024339 | | 1/2001 |
| JP | 2005-005413 | | 1/2005 |
| KR | 1020050101946 | | 10/2005 |
| TW | 456162 | | 9/2001 |
| WO | WO 95/26122 | * | 9/1995 |

OTHER PUBLICATIONS

Gerhard Moosburger; "Leiterplatten-Kompendium"; Elektronik, vol. 40, No. 23, p. 136-141, published Nov. 12, 1991; 6 pages; 1 page translation.

Japanese Patent Office, Office Action issued on Japanese Patent Application No. 2005-089551 dated Sep. 11, 2007.

Taiwanese Patent Office, Notice of Allowance issued on Taiwanese Patent Application No. 095135175 dated Oct. 22, 2009.

Japanese Patent Office, International Search Report and Written Opinion in International Patent Application No. PCT/JP2006/318691 dated Dec. 19, 2006.

Official Action issued in Korean Patent Application No. 10-2009-7006241, dated Sep. 6, 2011, 8 pages.

* cited by examiner

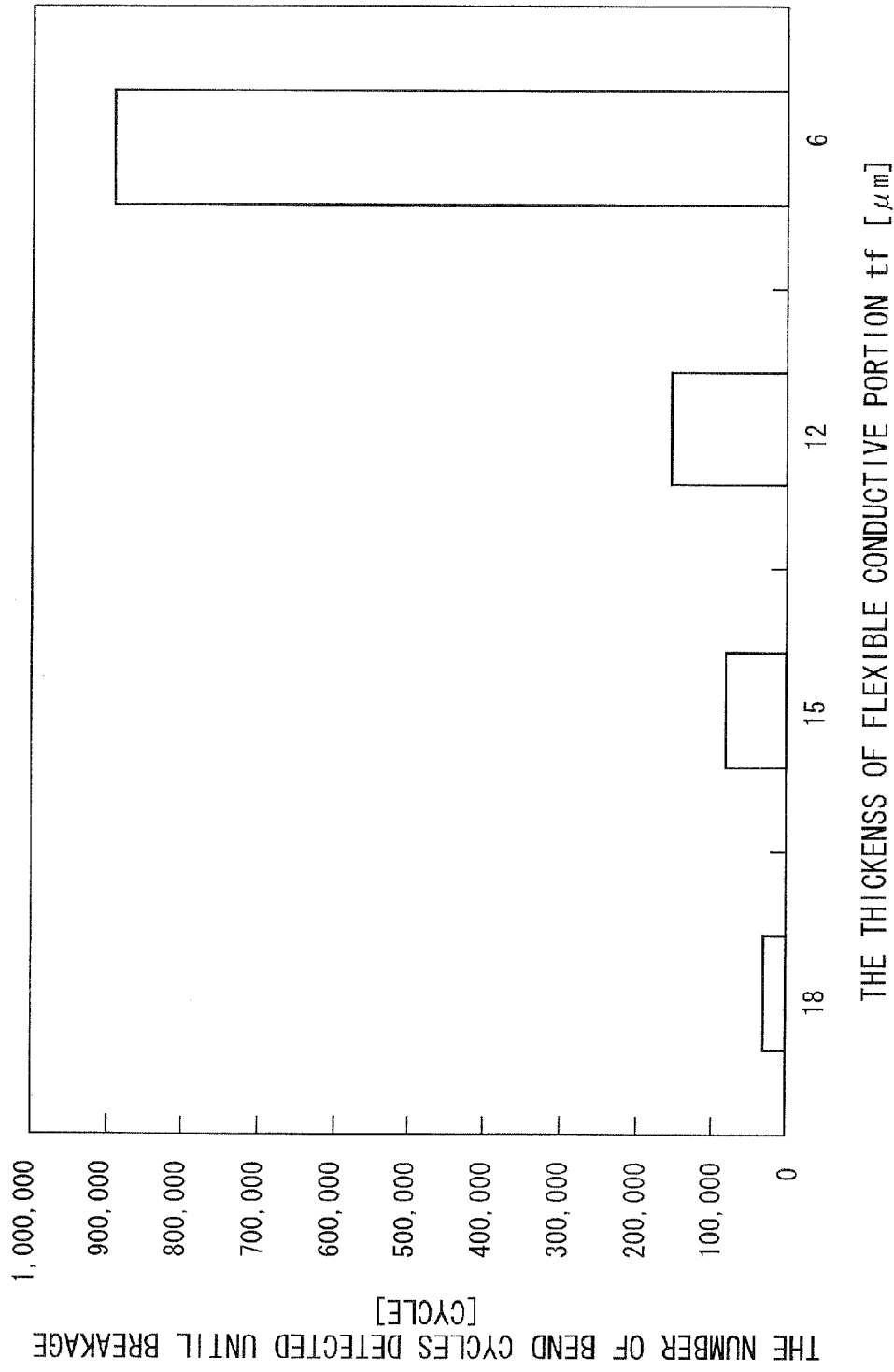

FIG. 6

| MATERIAL FOR RIDGED LAYER | ELASTICITY OF RIDGED LAYER | THE NUMBER OF BEND CYCLES DETECTED UNTIL BREAKAGE [CYCLE] |
|---|---|---|
| EPOXY RESIN (PURE EPOXY RESIN) | 3.2GPa | 25,342 (CRACKING IN RIDGED LAYER) |
| GLASS-FIBER-CONTAINING EPOXY RESIN | 20GPa | 897,585 |

FIG. 7

| POSITION OF VARIATION OF CONDUCTIVE LAYER THICKNESS | THE NUMBER OF BEND CYCLES DETECTED UNTIL BREAKAGE [CYCLE] |
|---|---|
| BOUNDARY BETWEEN RIDGED PORTION AND FLEXIBLE PORTION | 328,628 (CRACKING AT A POSITION OF VARIATION OF CONDUCTIVE LAYER THICKNESS) |
| POSITION ON RIDGED PORTION DISTANCED BY 1 MM FROM THE BOUNDARY | 897,585 |

FLEX-RIGID PRINTED WIRING BOARD AND MANUFACTURING METHOD THEREOF

TECHNICAL FIELD

The present invention relates to a flex-rigid printed wiring board including a rigid portion capable of mounting a component and a foldable flexible portion that is connected to the rigid portion, and a method of manufacturing the printed wiring board.

BACKGROUND ART

As is widely known, flex-rigid printed wiring boards are presently being used in various electrical appliances. A flex-rigid printed wiring board generally includes a rigid portion capable of mounting a component, and a foldable flexible portion that is connected to the rigid portion.

As one example of this type of technology, Patent Literature 1 discloses a flex-rigid printed wiring board wherein copper layers having low crystal orientations are deposited beforehand over copper layers having high orientation on both sides of a base film, and a laminated body including a conductive circuit is joined thereto. This configuration can suppress disconnections caused by deformation of the flexible portion, while providing wirings that have no electrical anisotropy and increasing durability.

[Patent Document 1] Japanese laid-open patent publication No. 2005-5413

DISCLOSURE OF THE INVENTION

Problems to be Solved by the Invention

However, when coppers layers having different orientations are formed as in the prior art, considerable work is required to form the copper layers, and, since a plurality of copper layers are formed, the thickness of the flexible portion increases, resulting in a problem that there is a danger that the flexible portion will lose its flexibility.

One conceivable method of countering this is to form copper layers having a predetermined thickness on both faces of the base film, and thin the copper layers by etching (half-etching) until midway in their thickness direction; this reduces the stress generated in the conductive internal portion along the bend, thereby retaining the flexibility of the flexible portion while increasing its fracture-strength. However, half-etching of the copper layers also reduces the thickness of the copper layers formed in the rigid parts, leading to problems that make it difficult to maintain conductivity, such as increased wiring resistance.

It is therefore an object of the present invention to provide a flex-rigid printed wiring board which can retain flexibility of the flexible portion while increasing durability of the flexible portion against folding, and, in addition, can ensure conduction in the rigid portion, and a method of manufacturing the printed wiring board.

Means for Solving the Problems

According to a first aspect of the invention, a flex-rigid printed wiring board includes a base film; and a conductor layer provided on at least one face of the base film. The wiring board including the base film has a rigid region and a flexible region. An average thickness "tf" of the conductor layer on the base film in the flexible region and an average thickness "tR" of the conductor layer on the base film in the rigid region satisfy a relationship of tf<tR.

By thinning the flexible portion conductor layer formed on the base film (the conductor layer formed in the flexible region) in comparison with the rigid portion conductor layer (the conductor layer formed in the rigid region), durability against bending in the flexible portion can be enhanced. On the other hand, since the rigid portion conductor layer is thicker than the flexible portion conductor layer, increase in the wiring resistance can be minimized, while retaining the flexibility and durability of the flexible portion and ensuring its electrical reliability. Also, since the flexible portion conductor layer is formed across the positions where the flexible portion is formed, approximately equal durability against bending can be obtained at all positions of the flexible portion. This makes it possible to suppress a state where, when the flexible portion is folded and bent, bend stress concentrates at a specific position of the flexible portion. Since the rigid portion conductor layer is thicker than the flexible portion conductor layer, an increase in the wiring resistance caused by the rigid portion conductor layer can be suppressed. According to investigations conducted by the inventors, durability improves proportionally when tf is thinner with comparison to tR; less than $(2/3) \times tR$ is preferable, and less than $(1/3) \times tR$ is more preferable. During thinning, for example, when using sputtering method to form a thin conductor layer, the minimum thickness permitted by the step is preferable, due to a likelihood of etching unevenness. Generally, when forming a thin conductor layer in the flexible portion by etching method, a thickness of more than approximately 1 μm is preferable when considering manufacturing yield and so on, whereas, when forming a thin conductor layer in the flexible portion by a method such as non-electrolytic plating or sputtering method, a thickness of more than approximately 0.1 μm is preferable when considering manufacturing yield and so on.

Preferably, the rigid region is constituted by laminating a rigid layer having a high elastic modulus in comparison with the base film on at least one top-face side of the base film.

Preferably, the rigid region is a glass fiber-containing layer.

Preferably, a boundary between the rigid region and the flexible region is defined at a boundary of the rigid region with the flexible region, a thickness tB of the conductor layer on the base film at the boundary position and the average thickness tR of the conductor layer on the base film formed in the rigid region satisfy a relationship of tB<tR.

According to a second aspect of the invention, a flex-rigid printed wiring board includes a plurality of conductor wirings formed on at least one face of a base film. One region of the wiring board containing the base film being a rigid region, and an another region containing the base film being a flexible region. A thickness "ti" of at least one wiring of the plurality of conductor wirings on the base film formed in the flexible region is small in comparison with an average thickness "tR" of the conductor layer on the base film formed in the rigid region.

Preferably, the rigid region is constituted by laminating a rigid layer having a high elastic modulus in comparison with the base film on at least one top-face side of the base film.

Preferably, the rigid region is a glass fiber-containing layer.

Preferably, a boundary between the rigid region and the flexible region is defined at a boundary of the rigid region with the flexible region, a thickness "tiB" of at least one wiring on the base film at the boundary position and the average thickness "tR" of the conductor layer on the base film formed in the rigid region satisfy a relationship of tiB<tR.

According to the invention, since the rigid layer that constitutes the rigid portion has a high elastic modulus in comparison with the base film, stress generated in the rigid portion wiring in the rigid portion can be alleviated, and, since stress accompanying the bending of the flexible portion is generated with respect to the flexible portion, long-term reliability can be ensured. While there are no particular limitations on the material for constituting the rigid portion provided that it has a high elastic modulus in comparison with the base film, a layer of glass fiber containing resin or adhesive and the like is preferable with regard to manufacturing costs. A composite material whose elastic rate has been increased by adding a filler such as silica or ceramic to synthetic resin, or such like, can also be used.

When there is a thickness-change point of the rigid portion conductor layer and the flexible portion conductor layer at the boundary between the flexible portion and the rigid portion, there is a possibility that stress generated when the flexible portion is bent will concentrate at the conductor thickness-change point. To prevent breakage of the conductor layer arising from this, the boundary and the conductor layer thickness-change point are preferably arranged at mutually different positions. According to the investigations of the inventors, it is preferable that the conductor layer thickness-change point is on the rigid portion side of the boundary portion. If the conductor layer thickness-change point is on the flexible portion side of the boundary portion, stress generated by the bend concentrates at the conductor layer thickness-change point, and the conductor layer is liable to break. In other words, the thickness "tB" of the conductor layer on the base film at the boundary portion has a relationship to the average thickness "tR" of the conductor layer in the rigid portion of tB<tR. The boundary between the flexible portion and the rigid portion of the invention is defined by an end face on the flexible portion side of the rigid portion (see FIG. 10).

According to the investigations of the inventors, the invention applies not only to the entire conductor layer on a base film in the flexible portion and the rigid portion, but also to each wiring obtained by patterning the conductor layer on the base film. That is, the same argument applies when the thickness tf is modified to the thickness ti of at least one wiring among the plurality of wirings of the flexible portion on the base film.

According to a third aspect of the invention, a method of manufacturing a flex-rigid printed wiring board includes the following processes. A first conductor film is formed on at least one face of a base film. The first conductor film is selectively etched so that the first conductor film has a thinner portion being thinner than the other portion. The thinner portion performs as a flexible portion. A passivation layer is formed over the base film. A prepreg layer and a third conductor film are stacked sequentially over the base film. The prepreg layer has an opening that overlaps the flexible portion, followed by carrying out a thermo-compression bonding process.

According to a fourth aspect of the invention, a method of manufacturing a flex-rigid printed wiring board includes the following processes. A first conductor film is formed on a base film. A photoresist mask is formed, which covers a flexible region of the first conductor. The photoresist mask has an opening which overlaps a ridged wiring region of the first conductor. A second conductor film is formed in the opening of the photoresist mask so that the second conductor film is disposed on the ridged wiring region. The photoresist mask is removed. A passivation film is adhered to the base film. A prepreg layer and a third conductor film are sequentially stacked over the base film. The prepreg layer has an opening that overlaps the flexible region, followed by carrying out a thermo-compression bonding process.

According to this invention, since the conductor film is formed on the base film by plating method or sputtering method, it is easy to obtain a thin conductor layer. Moreover, since the wiring of the rigid portion can be formed selectively in the rigid portion wiring formation region by non-electrolytic plating or electrolytic plating, there is an advantage that a detailed wiring pattern can be easily obtained.

According to a fifth aspect of the invention, the manufacturing method includes the following processes. A first conductor film is formed on a base film. A photosensitive protection film is formed, which covers a flexible region of the first conductor. The photosensitive protection film has an opening which overlaps a ridged region of the first conductor. The photosensitive protection film is cured. A second conductor film is formed in the opening of the photosensitive protection film so that the second conductor film is disposed on the ridged region. A passivation film is adhered to the base film. A prepreg layer and a third conductor film are stacked sequentially over the base film. The prepreg layer has an opening that overlaps the flexible region, followed by carrying out a thermo-compression bonding process.

According to this invention, since the conductor film is formed on the base film by plating method or sputtering method, it is easy to obtain a thin conductor layer. Moreover, since the wiring of the rigid portion can be formed selectively in the rigid portion wiring formation region by non-electrolytic plating or electrolytic plating, there is an advantage that a detailed wiring pattern can be easily obtained. Moreover, since the photosensitive protective film remains on the first conductor film on the base film in the rigid portion such that it becomes the same thickness as the second conductor film, even if the wiring in the rigid portion is thick, manufacturing yield can be enhanced without generates a noticeable step in the wiring layer. Moreover, since the photosensitive resin protective film becomes the protective film of the wiring of the flexible portion on the base film, there is no need to apply a separate protective film, enabling the manufacturing cost to be reduced.

Effects of the Invention

According to the invention, since wiring breakage due to bending of the flexible portion can be suppressed, it is possible to manufacture a flex-rigid printed wiring board having high durability and high reliability. Furthermore, according to the invention, the thickness of the conductor on the base film in the rigid portion can be increased in comparison to the conductor thickness on the base film in the flexible portion, increase in wiring resistance can be suppressed. Moreover, according to the invention, since the conductor layer change point on the base film is on the rigid portion side of the boundary of the rigid portion with the flexible portion, it is possible to retain durability against bending, reliability, and flexibility.

BRIEF DESCRIPTION OF THE DRAWINGS

FIG. 4 is a diagram of a number of bend cycles detected until wiring breakage in a flexible portion in a repetition bending test during which both sides are bent.

FIG. 6 is a characteristics diagram of bend-resistance performance when a constituent material of a rigid layer is modified by removing glass fiber from an adhesive layer containing glass-fiber shown in Example 1.

FIG. 7 is a characteristics diagram of bend-resistance performances when a conductor film thickness-change point on a base film is positioned at the boundary between a rigid portion and a flexible portion, and when it is positioned 1 mm from the boundary to the rigid portion side.

REFERENCE NUMERALS

Figure 1:
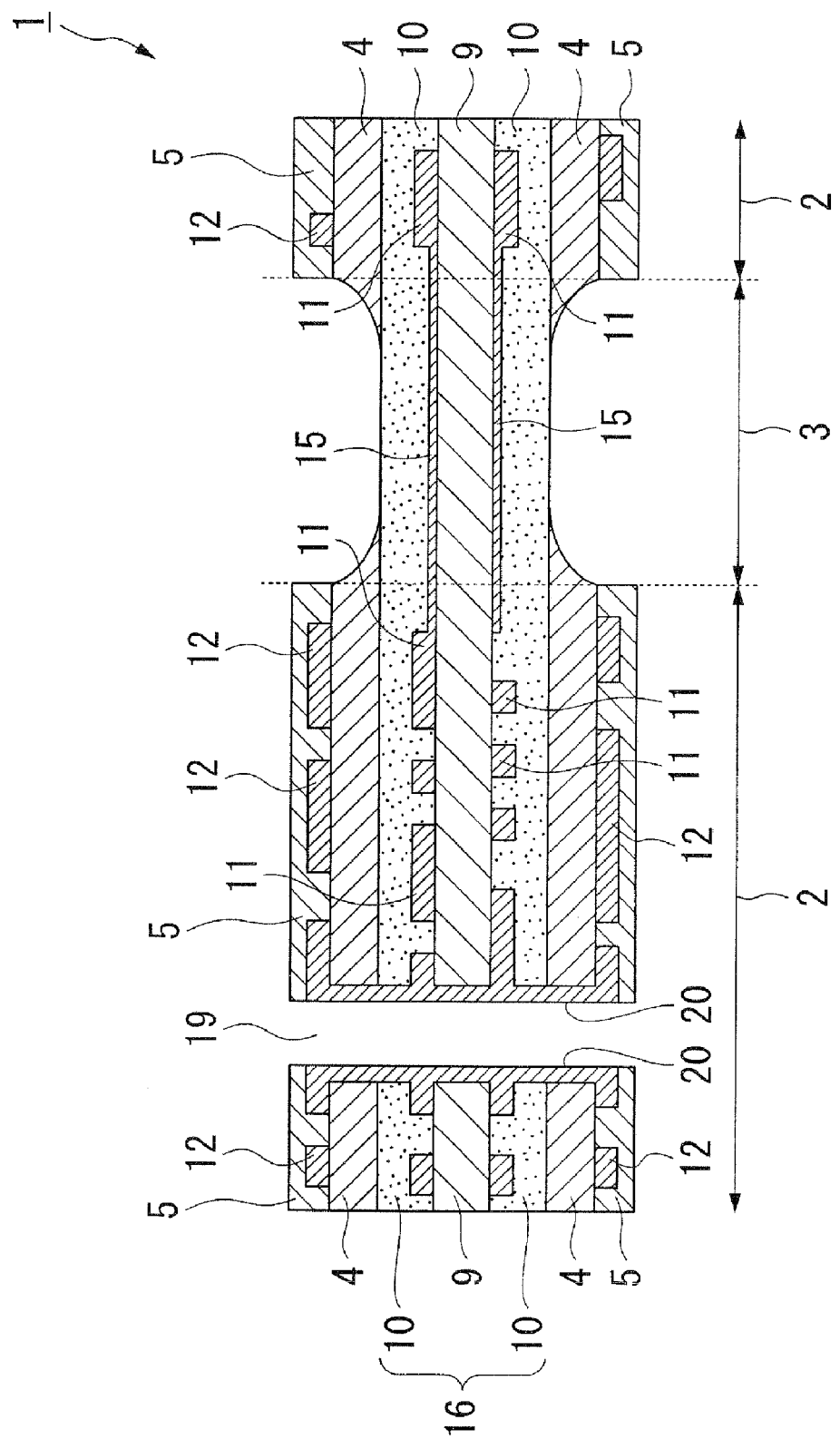
FIG. 1 is a cross-sectional view of primary parts of a flex-rigid printed wiring board in an embodiment of the invention.

1 Flex-rigid printed wiring board
2 Rigid portion
3 Flexible portion
4 Insulating resin layer
9 Base film
11 Rigid conductor layer
15 Flexible conductor layer
21 First conductor layer
31 Third conductor layer

BEST MODES FOR CARRYING OUT THE INVENTION

Subsequently, best modes for carrying out the invention will be explained with reference to the drawings. A flex-rigid printed wiring board in an embodiment of the invention will be explained together with the drawings. Firstly, a flex-rigid printed wiring board manufactured according to an embodiment of the invention will be explained using FIG. 1. FIG. 1 is a cross-sectional view of primary parts of a flex-rigid printed wiring board in an embodiment of the invention.

As shown in FIG. 1, a flex-rigid printed wiring board 1 includes a rigid portion 2 where a component can be mounted, and a foldable flexible portion 3 that is connected to the rigid portion 2. The flexible portion 3 is includes a base film 9, and coverlay films 10 and 10 that are laminated on both sides of the base film 9. These are collectively described as laminated film 16.

The base film 9 is usually made from a heat-resistant resin such as polyimide or polyester. The coverlay films 10 and 10 are laminated on both faces of the base film 9, and function as insulators that cover metal conductors 11 and 15. As the coverlay films 10 and 10, it is usual to use insulating films of the same material as the base film 9, such as polyimide or polyester.

The rigid portion 2 includes a rigid printed wiring board 17 that is laminated on a laminated film 16 having the same structure as the flexible portion 3, with an insulating resin layer 4 made from prepreg therebetween. Here, prepreg denotes a material produced by impregnating a base material such as glass fabric or paper with a resin such as polyimide, and drying this to a partially cured state. A metal conductor 12 of copper foil or the like is then pasted onto the rigid printed wiring board 17, and a circuit pattern is fabricated in the metal conductor 12. Moreover, a solder resist 5 is formed on the rigid printed wiring board 17 and covers the top face of the metal conductor 12.

A through-hole 19 perforates the thick direction of the rigid portion 2. Inner peripheral side walls that partition the through-hole 19 are plated with a metal conductor such as copper to form a plated portion 20.

Thus the laminated film 16 is provided across the rigid portion 2 and the flexible portion 3. A metal conductor (flexible portion conductor layer 15) of copper foil or the like having excellent bending properties is pasted onto the base film 9 that constitutes the laminated film 16 at a position where the flexible portion 3 will be formed. A metal conductor (rigid conductor layer) 11 of copper foil or the like, which the circuit pattern is formed on, is pasted onto the base film 9 at a position where the rigid portion 2 will be formed. The plated portion 20 and the rigid conductor layer 11 formed near the through-hole 19 are then connected, thereby electrically connecting the layers 9, 10, and 10 that constitute the laminated film 16.

The flexible conductive layer 15 is made from the same material as the rigid conductor layer 11, and is thinner (approximately one-third thinner) than the rigid conductor layer 11. An adhesive layer (not shown) separates the coverlay films 10 and 10 from the flexible conductive layer 15 and the rigid conductor layer 11. Thus the coverlay films 10 and 10 become a single piece with the base film 9.

A method of manufacturing the flex-rigid printed wiring board according to an embodiment of the invention will be explained using FIGS. 2A to 2G. FIGS. 2A to 2G are explanatory diagrams of steps of manufacturing a flex-rigid printed wiring board.

Figure 2A:
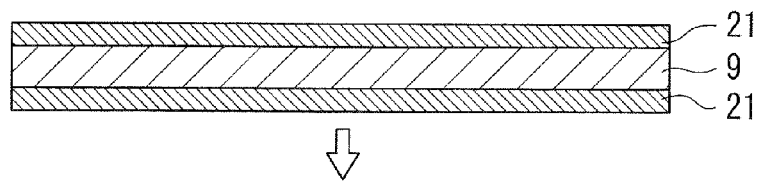
FIG. 2A is a diagram of a manufacturing step of a flex-rigid printed wiring board in an embodiment of the invention.

Firstly, as shown in FIG. 2A, conductor layers 21 made from a metal conductor such as copper are entirely pasted over both faces of a base film 9. The thickness of each conductor layer 21 is roughly the same as the thickness of the rigid conductor layer 11 and is set at a thickness sufficient for conduction.

Figure 2B:
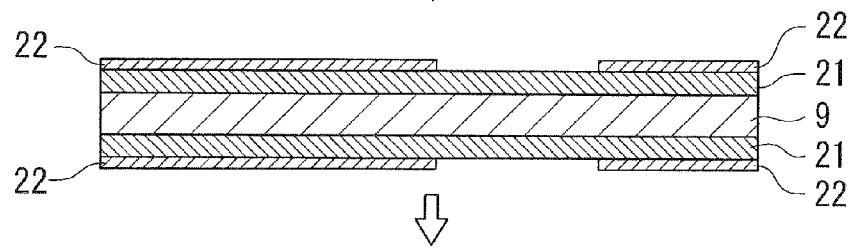
FIG. 2B is a diagram of a manufacturing step of a flex-rigid printed wiring board in an embodiment of the invention.

Then, as shown in FIG. 2B, an etching resist 22 is laminated in each conductor 21 in a formation region of a rigid portion 2. This etching resist 22 is preferably formed by applying a photosensitive resist over the entire face of the conductor layer 21, exposing positions of a flexible portion 3 thereon to ultraviolet light using a photomask, and then performing development.

Figure 2C:
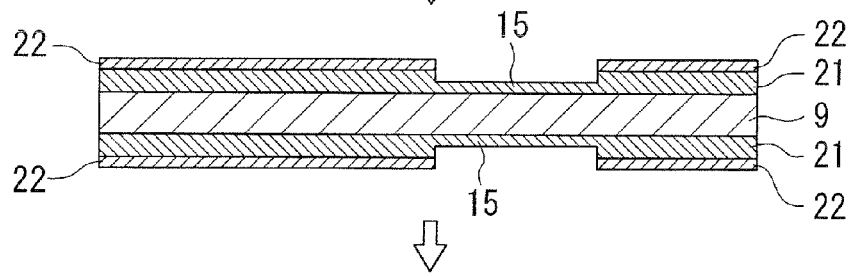
FIG. 2C is a diagram of a manufacturing step of a flex-rigid printed wiring board in an embodiment of the invention.

As shown in FIG. 2C, each conductor layer 21 in the formation region of the flexible portion 3 is subjected to a half-etching process. This half-etching process thins the conductor layer 21 in the formation region of the flexible portion 3 to a midway point (approximately halfway) through its thickness direction. This thinned position becomes a flexible conductor layer 15. The half-etching process is preferably performed with an etching solution using, for example, sulfuric acid hydrogen peroxide mixture. Physically processes such as laser trimming, ion milling, sand blasting, and plasma etching, can also be used.

Figure 2D:
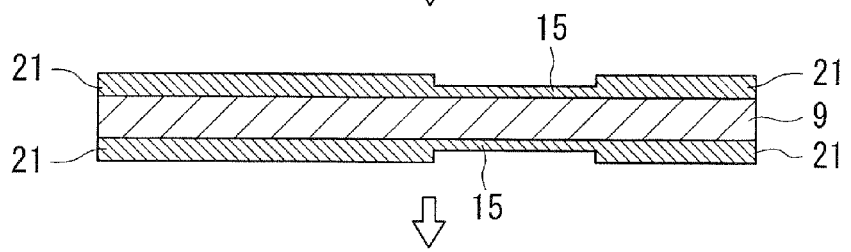
FIG. 2D is a diagram of a manufacturing step of a flex-rigid printed wiring board in an embodiment of the invention.

As shown in FIG. 2D, the etching resist 22 is then removed. An alkaline solution is preferably used in performing this process.

Figure 2E:
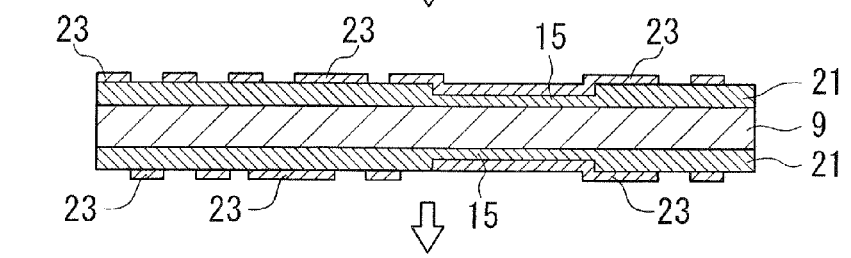
FIG. 2E is a diagram of a manufacturing step of a flex-rigid printed wiring board in an embodiment of the invention.

Then, as shown in FIG. 2E, an etching resist 23 for circuit-formation is laminated. The etching resist 23 is preferably formed by applying a photosensitive resist, exposing this to ultraviolet light using a photomask, and developing it, such that a predetermined printed pattern is obtained on the top face of each conductor layer 21 for forming the rigid portion 2.

Figure 2F:
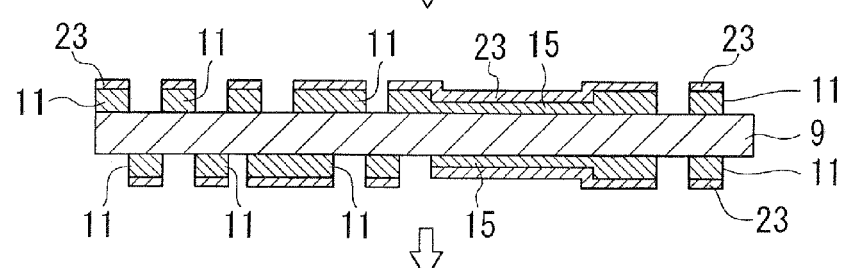
FIG. 2F is a diagram of a manufacturing step of a flex-rigid printed wiring board in an embodiment of the invention.

As shown in FIG. 2F, an etching process is then performed. In this etching process, the conductor layer 21 at a position where the etching resist 22 is not laminated is etched away, forming a rigid conductor layer 11 that constitutes a circuit pattern in the rigid portion 2. As in the process shown in FIG. 2C, this etching process can be performed with, for example, sulfuric acid hydrogen peroxide mixture, and can also use physically etching processes.

Figure 2G:
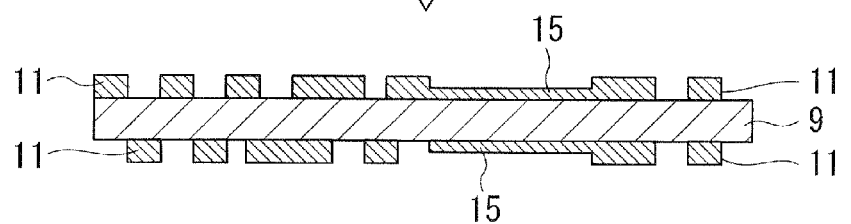
FIG. 2G is a diagram of a manufacturing step of a flex-rigid printed wiring board in an embodiment of the invention.

As shown in FIG. 2G, the etching resist 23 is then removed. As in FIG. 2D, an alkaline solution is preferably used in performing this process.

In this manner, a flexible conductor layer 15 that is thinner than the rigid conductor layer 11 formed in the rigid portion 2 can be formed on both faces of the base film 9.

Thereafter, an adhesive agent is applied and the coverlay films 10 and 19 are affixed to form the laminated film 16. A prepreg 4 is formed at positions for constituting the rigid portion 2 on both faces of the laminated film 16, and a metal conductor 12 and a solder resist 5 are formed on the prepreg 4. A through-hole 19 is provided at a predetermined point in the rigid portion 2 and a plated portion 20 is formed; these steps will not be explained in detail.

As described above, when the flex-rigid printed wiring board 1 is constituted in this manner, the flexible conductor layer 15 formed on the base film 9 can increase the durability against folding of the flexible portion 3. Since the flexible conductor layer 15 is thinner than the rigid conductor layer 11, the flexibility of the flexible portion 3 is retained accordingly.

Also, since the flexible conductor layer 15 is formed across positions for forming the flexible portion 3, the durability against folding of the flexible portion 3 can be made approximately the same at each position for forming the flexible portion 3. Therefore, when the flexible portion 3 is folded, bend stress can be prevented from concentrating at a specific position of the flexible portion 3.

In regard to this point, the flexible conductor layer 15 is preferably formed such that its thickness is uniform at all positions.

Since the rigid conductor layer 11 is thicker than the flexible conductor layer 15, conduction between the rigid conductor layer 11 and the plated portion 20 can easily be maintained.

Of course, the content of the invention is not limited to the embodiment described above. For example, while in the embodiment, the coverlay films 10 and 10 are laminated on both sides of the base film 9, it is acceptable to provide a coverlay film 10 on only one side, or not to provide a coverlay film 10 at all. Further, while it is preferable with regard to rigidity to use a prepreg as described in the embodiment, an insulating resin layer can be formed using another material instead.

In forming the flexible conductor layer 15, while half-etching is preferable as mentioned above, there is no limitation on this method, and another method can be employed instead.

Examples of the invention will be explained.

First Example

A flex-rigid printed wiring board according to a first example of the invention will be explained using FIGS. 3A to 3F. FIGS. 3A to 3F are schematic diagrams of steps of manufacturing a flex-rigid printed wiring board according to a first example of the invention.

Figure 3A:
FIG. 3A is a schematic diagram of a manufacturing step of a flex-rigid printed wiring board in a first example of the invention.
Figure 3B:
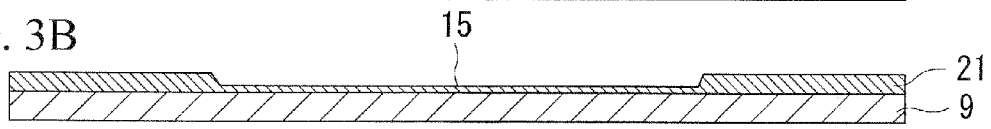
FIG. 3B is a schematic diagram of a manufacturing step of a flex-rigid printed wiring board in a first example of the invention.

Firstly, a dry-type photoresist was laminated on a base film 9 made from a copper-clad polyimide film (copper thickness: 18 μm, polyimide thickness 15 μm), and the photoresist at a position corresponding to the flexible portion 3 was removed using a conventional photolithography method to form an opening; copper foil (first conductor film) 21 exposed at the opening was etched with a cupric chloride solution, and washing and drying were performed before all the copper foil was removed by etching, thus obtaining the half-etched state shown in FIG. 3B.

Figure 3C:
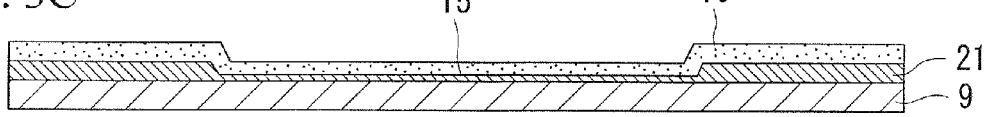
FIG. 3C is a schematic diagram of a manufacturing step of a flex-rigid printed wiring board in a first example of the invention.

As shown in FIG. 3C, the etching time was controlled such that the average thickness of the flexible portion residual copper foil 15 after half-etching was 15 μm, 12 μm, and 6 μm. A coverlay (Nikaflex, manufactured by Nikkan Industries Co. Ltd) 10 was then applied.

Figure 3D:
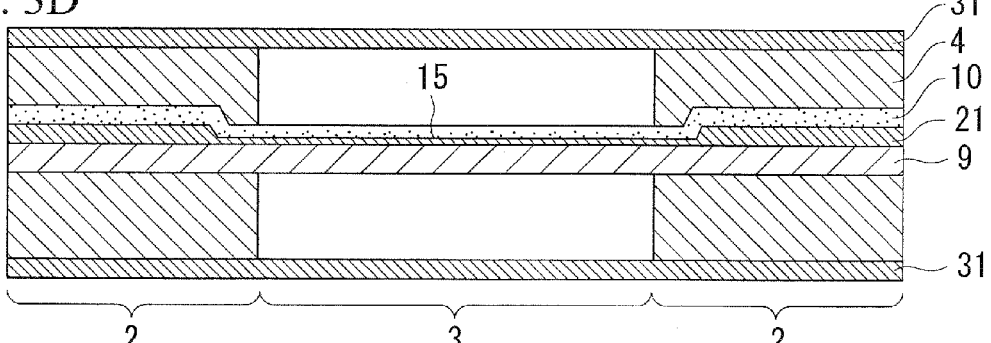
FIG. 3D is a schematic diagram of a manufacturing step of a flex-rigid printed wiring board in a first example of the invention.

Subsequently, as shown in FIG. 3D, a prepreg (adhesive layer containing glass fiber) 4 which a position corresponding to the flexible portion 3 was cut away from, and an 18-μm copper film (third conductor film) 31, were laminated, and a press process was performed for two to three hours at 2 to 3 MPs at 180° C., thereby forming a rigid portion 2.

Figure 3E:
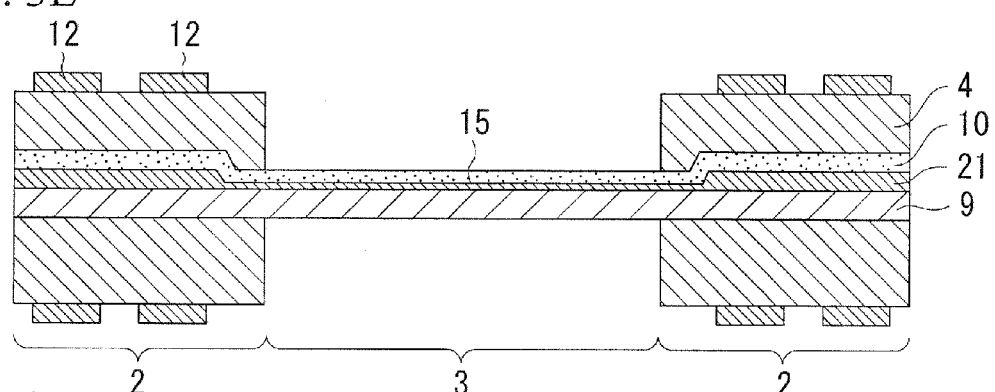
FIG. 3E is a schematic diagram of a manufacturing step of a flex-rigid printed wiring board in a first example of the invention.

As shown in FIG. 3E, a dry-type photoresist was laminated and photolithography was performed to form an outer-layer wiring 12 of the rigid portion 2, and a through-hole required for connecting to an inner layer was provided by a conventional method.

Figure 3F:
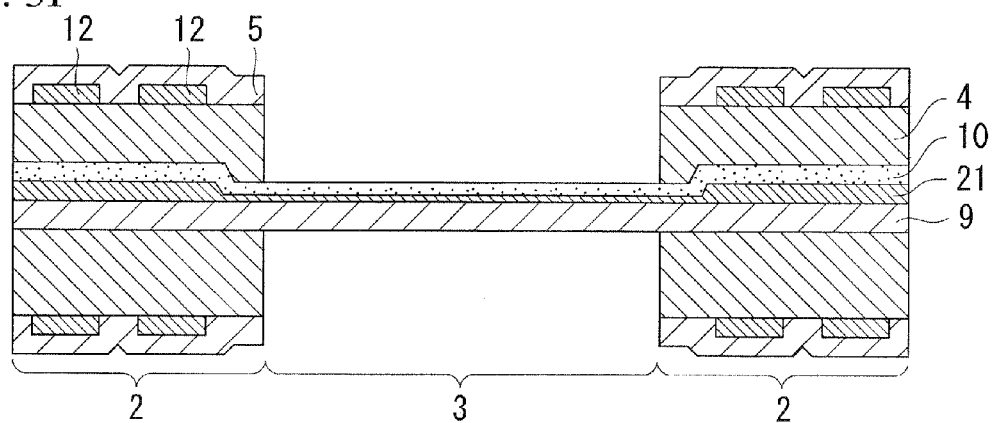
FIG. 3F is a schematic diagram of a manufacturing step of a flex-rigid printed wiring board in a first example of the invention.

Lastly, as shown in FIG. 3F, a solder resist layer 5 was formed on the rigid portion 2 using a conventional method, thereby obtaining the flex-rigid printed wiring board of this example.

Figure 5:
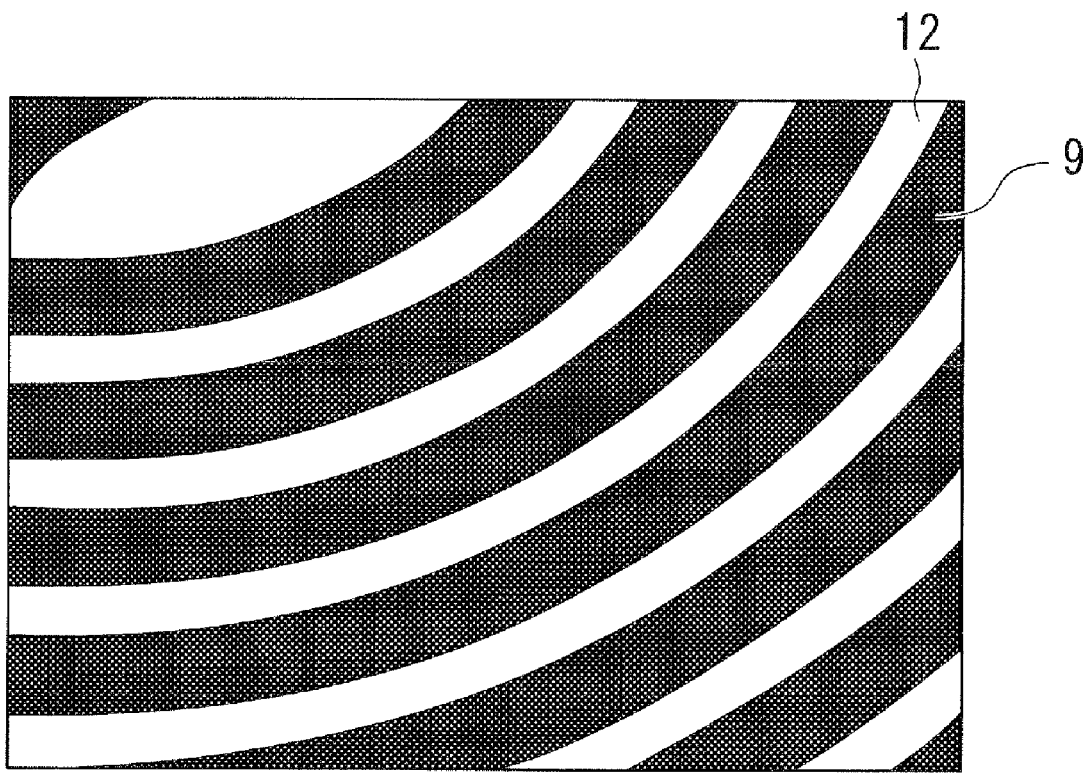
FIG. 5 is an explanatory diagram based on optical microscope photographs of a flex-rigid printed wiring board before and after bending.

FIG. 4 is a diagram of results obtained when the flex-rigid printed wiring board of this example was subjected to a repetition bending test. FIG. 4 illustrates the number of bend cycles detected until breakage of the wiring 12 in the flexible portion 3 in a repetition bending test during which both sides were bent; it can be seen that the copper thickness tR on the base film 9 of the rigid portion 2 was 18 μm, and that durability increased as the copper thickness in the rigid portion 3 was made thinner. Increased durability was apparent when thickness tf, which is two-thirds of the 18-μm copper thickness tR on the base film 9 of the rigid portion 2, was approximately less than 12 μm, and thirty-fold durability was obtained when a one-third tf was 6 μm. FIG. 5 is an explanatory diagram based on an optical microscope photograph of the flex-rigid printed wiring board before and after 600,000 bendings when tf=6 μm.

As shown in FIG. 5, even after 600,000 bendings, no damage such as cracks were observed, and excellent characteristics were obtained.

Example 2

A flex-rigid printed wiring board according to a second example of the invention will be explained using FIG. 6. FIG. 6 is a characteristics diagram of bend-resistance performance when a constituent material of a rigid layer is modified by removing glass fiber from an adhesive layer containing glass-fiber shown in Example 1. The test confirmed that, since the bending elastic ratio is low when the adhesive layer does not contain glass fiber, stress is generated in the wiring of the rigid portion where the conductor thickness was not reduced with respect to bending of the flexible portion, leading to breakage of the wiring. In contrast, when the adhesive layer contains glass fiber, the glass fiber layer alleviates stress, increasing the bend-resistance.

Example 3

A flex-rigid printed wiring board according to a third example of the invention will be explained using FIG. 7. FIG. 7 is a characteristics diagram of bend-resistance performances when a conductor layer thickness-change point on a base film was positioned at the boundary between a rigid portion and a flexible portion, and when it was positioned 1 mm from the boundary to the rigid portion side. When the conductor layer thickness-change point was at the boundary or on the flexible portion side, stress concentrated at the conductor layer thickness-change point, consequently reducing the bend-resistance. On the other hand, when the conductor layer thickness-change point was arranged in the rigid portion, bend-resistance was enhanced.

Example 4

Figure 8A:
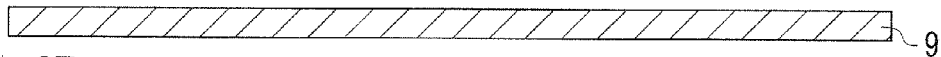
FIG. 8A is a schematic diagram of a manufacturing step of a flex-rigid printed wiring board in a fourth example of the invention.

A flex-rigid printed wiring board according to a fourth example of the invention will be explained using FIGS. 8A to 8G. FIGS. 8A to 8G are schematic diagrams of steps of manufacturing a flex-rigid printed wiring board in a fourth example of the invention. Firstly, as shown in FIG. 8A, a polyimide film was prepared as a base film 9.

Figure 8B:
FIG. 8B is a schematic diagram of a manufacturing step of a flex-rigid printed wiring board in a fourth example of the invention.

As shown in FIG. 8B, a copper film (first conductor film) 32 was formed on the base film 9 by sputtering. The thickness of this copper film 32 was 0.1 μm. The copper film 32 can be formed using non-electrolytic plating instead of sputtering.

Figure 8C:
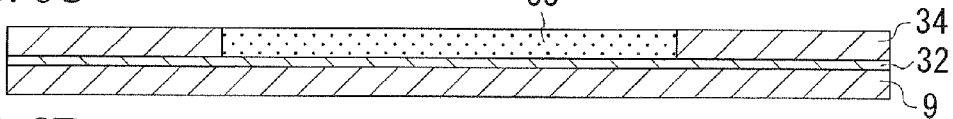
FIG. 8C is a schematic diagram of a manufacturing step of a flex-rigid printed wiring board in a fourth example of the invention.

As shown in FIG. 8C, a dry-type photoresist was laminated and patterned by conventional photolithography such that a photoresist 33 remained at a position corresponding to the flexible portion 3. Subsequently, a copper film (second conductor film) 34 was formed by non-electrolytic plating at a position corresponding to the rigid portion 2, with the copper film 32 exposed through an opening in the photoresist 33 as an underlay.

Figure 8D:
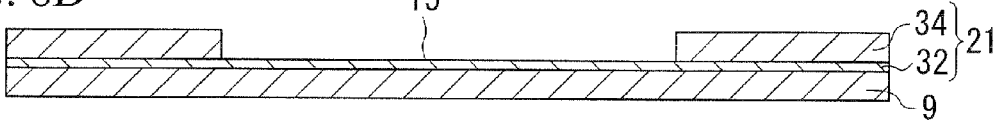
FIG. 8D is a schematic diagram of a manufacturing step of a flex-rigid printed wiring board in a fourth example of the invention.

As shown in FIG. 8D, the photoresist 33 remaining in the flexible portion 3 was then removed, obtaining a conductor layer 21 (32 and 34) on the base film 9.

Figure 8E:
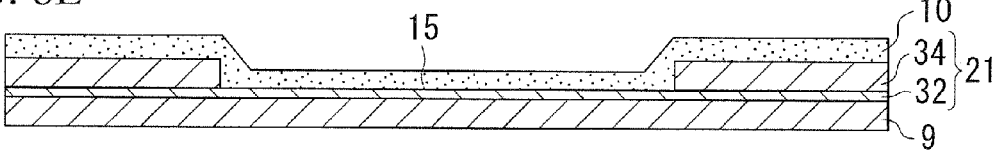
FIG. 8E is a schematic diagram of a manufacturing step of a flex-rigid printed wiring board in a fourth example of the invention.

As shown in FIG. 8E, a coverlay (Nikaflex, manufactured by Nikkan Industries Co. Ltd) 10 was applied.

Figure 8F:
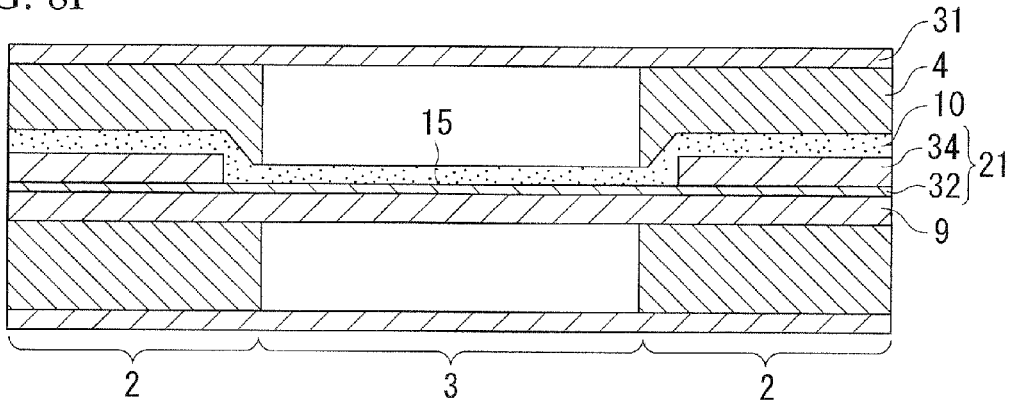
FIG. 8F is a schematic diagram of a manufacturing step of a flex-rigid printed wiring board in a fourth example of the invention.
Figure 8G:
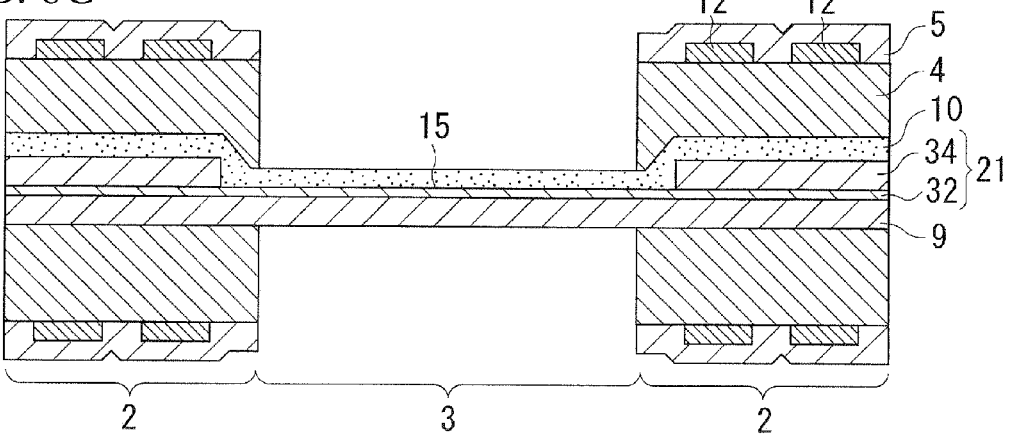
FIG. 8G is a schematic diagram of a manufacturing step of a flex-rigid printed wiring board in a fourth example of the invention.

Thereafter, as shown in FIGS. 8F and 8G, the flex-rigid printed wiring board of this example was obtained by repeating the same procedures as those in Example 1. When the flex-rigid printed wiring board thus obtained was subjected to a bend-resistance test, the results were the same as those for Example 1.

Example 5

A flex-rigid printed wiring board according to a fifth example of the invention will be explained using FIGS. 9A to 9E. FIGS. 9A to 9E are schematic diagrams of steps of manufacturing a flex-rigid printed wiring board according to a fifth example of the invention.

Figure 9A:
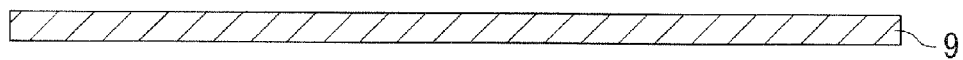
FIG. 9A is a schematic diagram of a manufacturing step of a flex-rigid printed wiring board in a fifth example of the invention.

Firstly, as shown in FIG. 9A, a polyimide film was prepared as a base film 9.

Figure 9B:
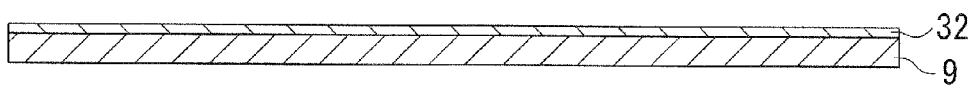
FIG. 9B is a schematic diagram of a manufacturing step of a flex-rigid printed wiring board in a fifth example of the invention.

As shown in FIG. 9B, a copper film (first conductor film) 32 was formed on the base film 9 by sputtering. The thickness of the copper film 32 was 0.1 μm. The copper film 32 can be formed using non-electrolytic plating instead of sputtering.

Figure 9C:
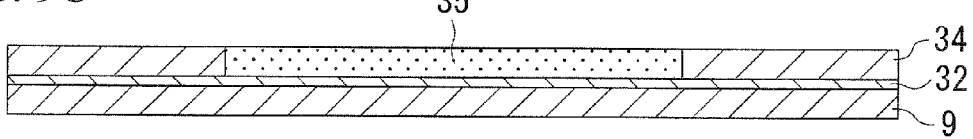
FIG. 9C is a schematic diagram of a manufacturing step of a flex-rigid printed wiring board in a fifth example of the invention.

As shown in FIG. 9C, a photosensitive protective layer 35 was applied using a conventional dip-coating method, a drying process was performed for thirty minutes in an N2 oven at 90° C., and the photosensitive protective layer 35 remaining in the flexible portion 3 was thereby hardened. Subsequently, a copper film (second conductor film) 34 was formed by non-electrolytic plating at a position corresponding to the rigid portion 2, with the copper film 32 exposed through an opening in the photoresist 33 as an underlay.

Figure 9D:
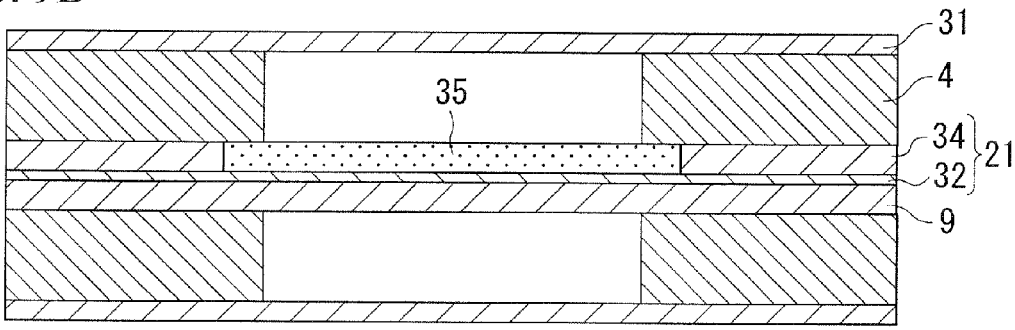
FIG. 9D is a schematic diagram of a manufacturing step of a flex-rigid printed wiring board in a fifth example of the invention.
Figure 9E:
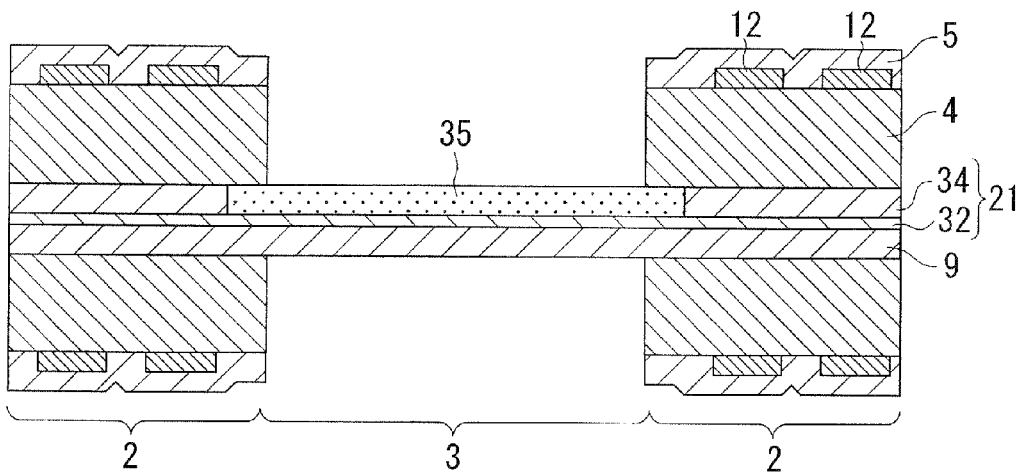
FIG. 9E is a schematic diagram of a manufacturing step of a flex-rigid printed wiring board in a fifth example of the invention.
Figure 10:
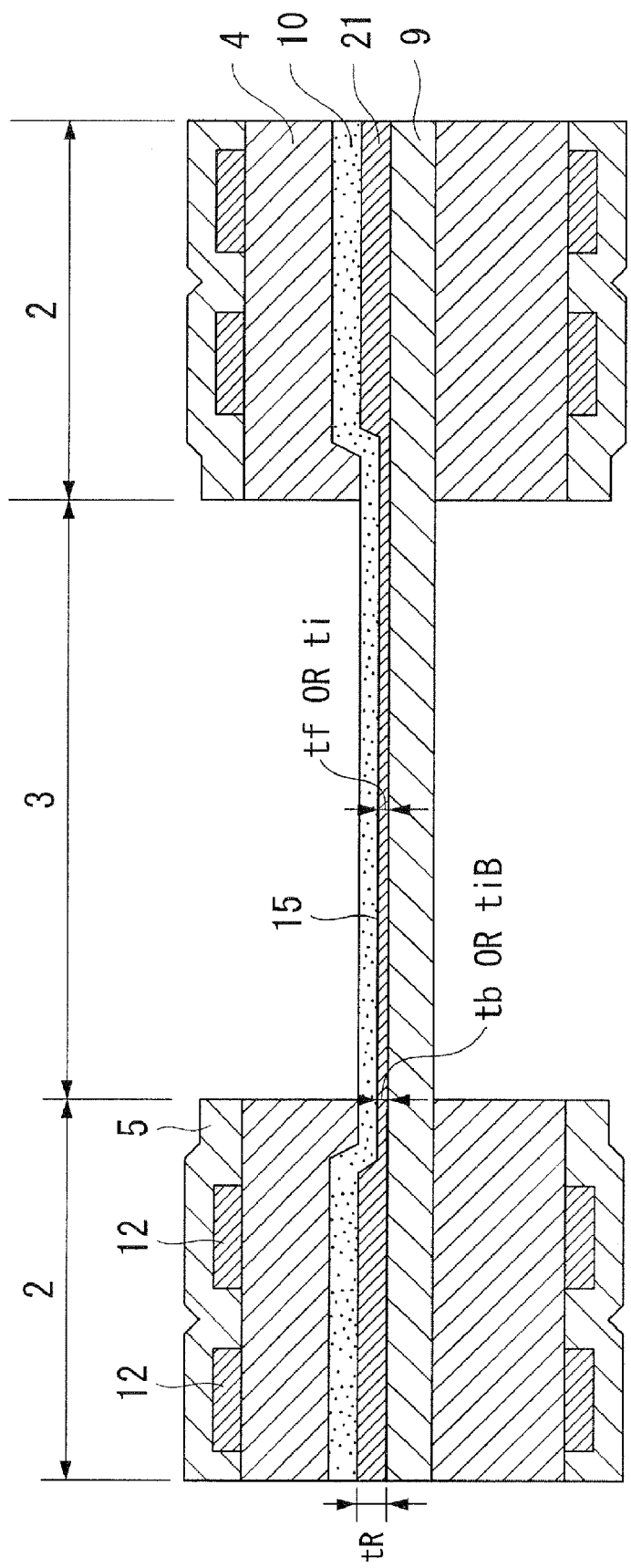
FIG. 10 is an explanatory diagram of a boundary between a flexible portion and a rigid portion in a flex-rigid printed wiring board of the invention.

Then, as shown in FIG. 9D, the photoresist remaining in the flexible portion 3 was removed, obtaining a conductor layer 21 (32 and 34) on the base film 9. Thereafter, as shown in FIGS. 9D and 9E, the flex-rigid printed wiring board of this example was obtained by repeating the same procedures as those in Example 1. When the flex-rigid printed wiring board thus obtained was subjected to a bend-resistance test, the results were the same as those for Example 1.

INDUSTRIAL APPLICABILITY

The invention can be used in a flex-rigid printed wiring board including a rigid portion capable of mounting a component, and a foldable flexible portion that is connected to the rigid portion, and in a method of manufacturing the printed wiring board.

The invention claimed is:

1. A flex-rigid printed wiring board comprising:
a base film; and
a conductor layer provided on at least one face of the base film,
wherein the wiring board including the base film has a rigid region and a flexible region,
an average thickness "tf" of the conductor layer on the base film in the flexible region and an average thickness "tR" of the conductor layer on the base film in the rigid region satisfy a relationship of tf<tR, and
the rigid region comprises a rigid layer being higher in elasticity than the base film, the rigid layer is provided on at least one face side of the base film.

2. The flex-rigid printed wiring board according to claim 1, wherein the rigid layer being a glass-fiber-containing layer.

3. The flex-rigid printed wiring board according to claim 1, wherein the rigid region and the flexible region are bounded by a boundary, and
a thickness "tB" of the conductor layer on the base film at the boundary and the average thickness "tR" of the conductor layer on the base film in the rigid region satisfy a relationship of tB<tR.

4. A flex-rigid printed wiring board comprising:
a base film; and
a plurality of conductor wirings formed on at least one face of the base film,
wherein the wiring board including the base film has a rigid region and a flexible region,
at least one wiring of the plurality of conductor wirings on the base film in the flexible region has a thickness "ti" that is smaller than an average thickness "tR" of the conductor layer on the base film in the rigid region,
the rigid region comprises a rigid layer being higher in elasticity than the base film, the ridid layer is provided on at least one face side of the base film.

5. The flex-rigid printed wiring board according to claim 4, wherein the rigid layer being a glass-fiber-containing layer.

6. The flex-rigid printed wiring board according to claim 5, wherein the rigid region and the flexible region are bounded by a boundary, and
a thickness "tiB" of at least one wiring on the base film at the boundary and the average thickness "tR" of the conductor layer on the base film in the rigid region satisfy a relationship of tiB<tR.

* * * * *